(12) United States Patent
Kubo et al.

(10) Patent No.: US 6,361,708 B1
(45) Date of Patent: *Mar. 26, 2002

(54) METHOD AND APPARATUS FOR POLISHING A METAL FILM

(75) Inventors: Akira Kubo; Mieko Suzuki, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/078,559

(22) Filed: May 14, 1998

(30) Foreign Application Priority Data

May 14, 1997 (JP) ............................................. 9-123940

(51) Int. Cl.⁷ ............................................. H01L 21/302
(52) U.S. Cl. .............................. 216/88; 216/90; 216/99; 216/100; 216/102; 216/105; 438/692; 438/701; 438/747
(58) Field of Search .................... 156/345; 252/795; 216/88, 89, 90, 91, 99, 100, 102, 105; 438/692, 693, 701, 745, 747, 757, 754

(56) References Cited

U.S. PATENT DOCUMENTS

| | | | |
|---|---|---|---|
| 4,956,313 A | 9/1990 | Cote et al. | 437/203 |
| 4,992,135 A | 2/1991 | Doan | 156/636 |
| 5,128,281 A | * 7/1992 | Dyer et al. | 438/693 |
| 5,236,548 A | * 8/1993 | Stadler et al. | 156/639 |
| 5,244,534 A | 9/1993 | Yu et al. | 156/636 |
| 5,681,215 A | * 10/1997 | Sherwood et al. | 451/388 |
| 5,885,900 A | 3/1999 | Schwartz | 438/697 |
| 5,958,288 A | * 9/1999 | Mueller et al. | 252/186.1 |

FOREIGN PATENT DOCUMENTS

| | | | |
|---|---|---|---|
| JP | 59-13331 | | 1/1984 |
| JP | 64-55845 | | 3/1989 |
| JP | 4-167448 | | 6/1992 |
| JP | 4-233224 | | 8/1992 |
| JP | 5-275366 | | 10/1993 |
| JP | 07-193030 | * | 7/1995 |
| JP | 08-85051 | * | 4/1996 |
| JP | 8-124886 | | 5/1996 |
| JP | 8-139060 | | 5/1996 |
| JP | 9-167800 | | 6/1997 |
| JP | 9-186234 | | 7/1997 |
| JP | 10-41310 | | 2/1998 |

* cited by examiner

Primary Examiner—George Goudreau
(74) Attorney, Agent, or Firm—Foley & Lardner

(57) ABSTRACT

A method and an apparatus for polishing a metal film formed on a semiconductor device are disclosed. A semiconductor wafer is immersed in an oxidizing solution before it is polished. As a result, the undesirable part of a W film deposited on the circumferential edge of the wafer is removed by etching.

6 Claims, 7 Drawing Sheets

METHOD AND APPARATUS FOR POLISHING A METAL FILM

BACKGROUND OF THE INVENTION

The present invention relates to a method and an apparatus for polishing a metal film and, more particularly, to a method and apparatus for polishing a metal film formed on a semiconductor device by a chemical mechanical polishing (CMP) procedure.

It is a common practice with a semiconductor device to form an insulation film (BPSG film) below a wiring on a wafer or similar substrate, form contact holes in the insulation film, and then form a metal film on the insulation film and the walls of the contact holes. Subsequently, the metal film is polished by the CMP procedure. CMP is effected on a polishing pad mounted on a rotatable platen by use of slurry containing $Al_2O_3$ or similar abrasive grain and $H_2O_2$, KOH, $NH_1OH$ or similar acid or base. A specific CMP procedure is taught in, e.g., U.S. Pat. No. 4,992,135.

The metal film has customarily been formed over the entire surface of a wafer in order to increase the effective number of chips. This, however, brings about a problem that the metal film turns round to the rear of the wafer via the circumferential edge of the wafer. The part of the metal film existing on the edge and the peripheral portion of the rear of the wafer cannot be removed by the CMP procedure and causes contamination to occur in the subsequent step. Specifically, when the wafer with such a metal film is positioned with respect to the polishing pad, the circumferential edge of the wafer is enclosed by a ring for preventing the wafer from jumping out. As a result, the metal film on the edge of the wafer cannot be removed even when use is made of a soft abrasive pad. Moreover, although the abrasive turns round to the rear of the wafer via the circumferential edge, the metal film on the front of the wafer is polished at a rate far higher than the etching rate of the metal film on the edge of the wafer. Consequently, the polishing operation ends before the metal film on the edge is fully polished.

Technologies relating to the present invention are also disclosed in, e.g., Japanese Patent Laid-Open Publication Nos. 64-55845, 4-167448, 4-233224, 5-275366, 8-124886, and 8-139060.

SUMMARY OF THE INVENTION

It is therefore an object of the present invention to provide a method and an apparatus for polishing a metal film formed on a semiconductor device and capable of removing an undesirable part of the metal film present on the circumferential edge and rear of a semiconductor wafer efficiently.

In accordance with the present invention, a method of polishing a metal film formed on a semiconductor wafer has the steps of immersing, before polishing the metal film, the wafer in at least one kind of oxidizing solution for a preselected period of time, and etching an undesirable part of the metal film by use of the oxidizing solution to thereby etch the undesirable part.

Also, in accordance with the present invention, in an apparatus for polishing a metal film formed on a semiconductor wafer, the semiconductor wafer is immersed, before polishing, in an oxidizing solution filling a bath to thereby etch and remove an undesirable part of the metal film.

Further, in accordance with the present invention, an apparatus for polishing a metal film formed on a semiconductor includes a rotating section for sucking, before polishing of the semiconductor wafer, the center of the semiconductor wafer and causing the wafer to spin. A polishing section causes abrasive pads to contact an undesirable part of the metal film deposited on the circumferential edge of the wafer spinning, and polishes and removes the undesirable part with an abrasive being fed to a position where the abrasive pads and the metal film contact each other.

BRIEF DESCRIPTION OF THE DRAWINGS

The above and other objects, features and advantages of the present invention will become apparent from the following detailed description taken with the accompanying drawings in which.

In the drawings, identical reference numerals denote identical structural elements.

DESCRIPTION OF THE PREFERRED EMBODIMENTS

Figure 1A:
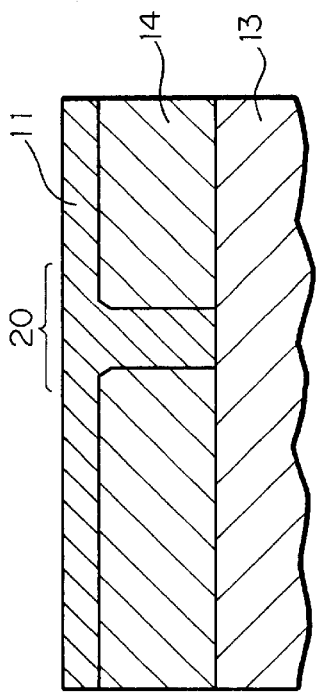
FIGS. 1A–1C show a conventional semiconductor device.
Figure 1B:
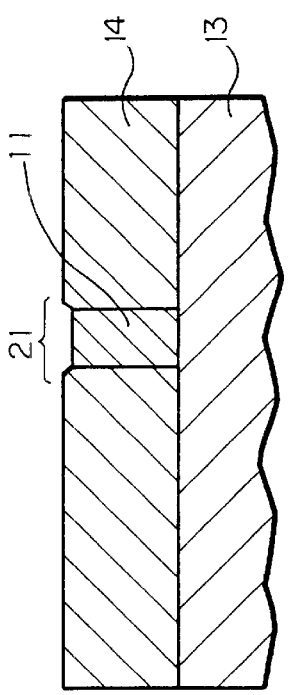
Figure 1C:
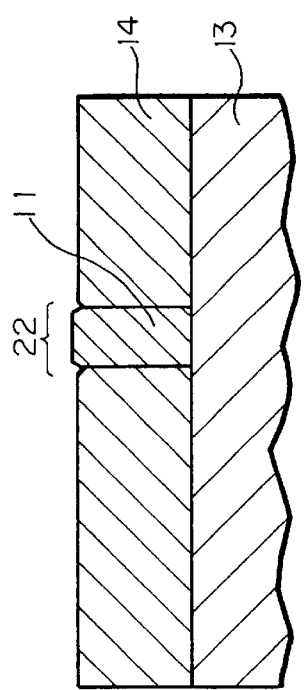

To better understand the present invention, brief reference will be made to a conventional semiconductor device, shown in FIGS. 1A–1C. As shown in FIG. 1A, the semiconductor device includes a wafer or similar semiconductor substrate 13. An insulation film below a wiring (BPSG film) 14 is formed on the substrate 13 and includes a contact hole 20. A 1,000 nm thick metal film (blanket W film) 11 is formed on the insulation film 14 and buried in the contact hole 20. The metal film 11 is polished by the CMP procedure mentioned earlier. As shown in FIG. 1B, the problem with the CMP method is that the surface of the metal film 11 buried in the contact film 20 is concave below the surface of the insulation film 14. To obviate such concavity, i.e., a concave plug 21, it is a common practice to selectively execute the CMP procedure with the insulation film 14. For the selective CMP method, use is made of colloidal silica slurry containing, e.g., $H_2O_2$ and KOH selectively acting on the insulation film 14. As shown in FIG. 1C, the CMP procedure using such slurry is continuously effected until a convex plug 22 rising slightly above the edge of the contact hole 20 has been formed.

However, the problem with the conventional polishing method is that the metal film 11 turns round even to the rear of the wafer 13 via the circumferential edge of the same, as discussed earlier. The part of the metal film 11 present on the edge and rear of the wafer 13 cannot be removed by polishing and brings about contamination in the subsequent step.

Preferred embodiments of the method and apparatus in accordance with the present invention and free from the above problem will be described hereinafter.

1st Embodiment

Figure 2:
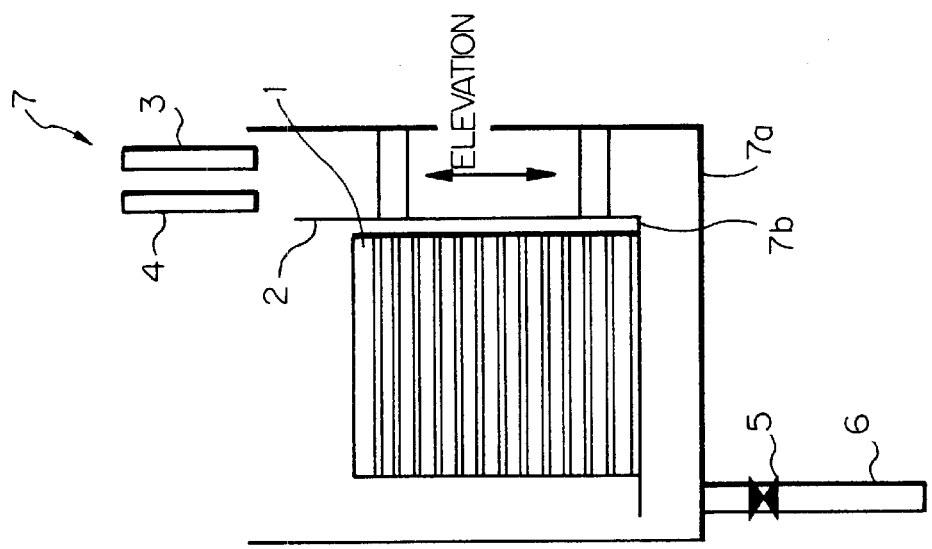
FIG. 2 shows a first embodiment of a polishing apparatus in accordance with the present invention.
Figure 2:
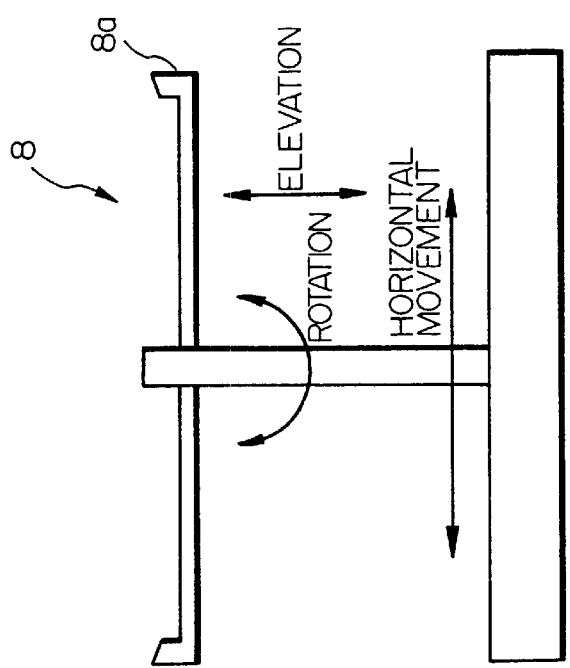
Figure 2:
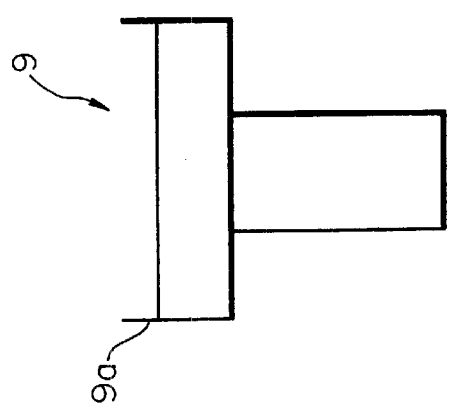

Referring to FIG. 2, a polishing device embodying the present invention is generally made up of an etching section 7, a wafer conveying section 8, and an unloader section 9.

The etching section 7 Includes a bath 7a, an elevator 7b, a feed pipe 3 for feeding an oxidizing solution, and a feed pipe 4 for feeding pure water or cleaning liquid. The bath 7a is formed with an outlet 6 in its bottom. The outlet 6 is selectively opened or closed by a valve 5. The oxidizing solution and pure water are introduced into the bath 7a via the pipes 3 and 4, respectively.

Figure 3A:
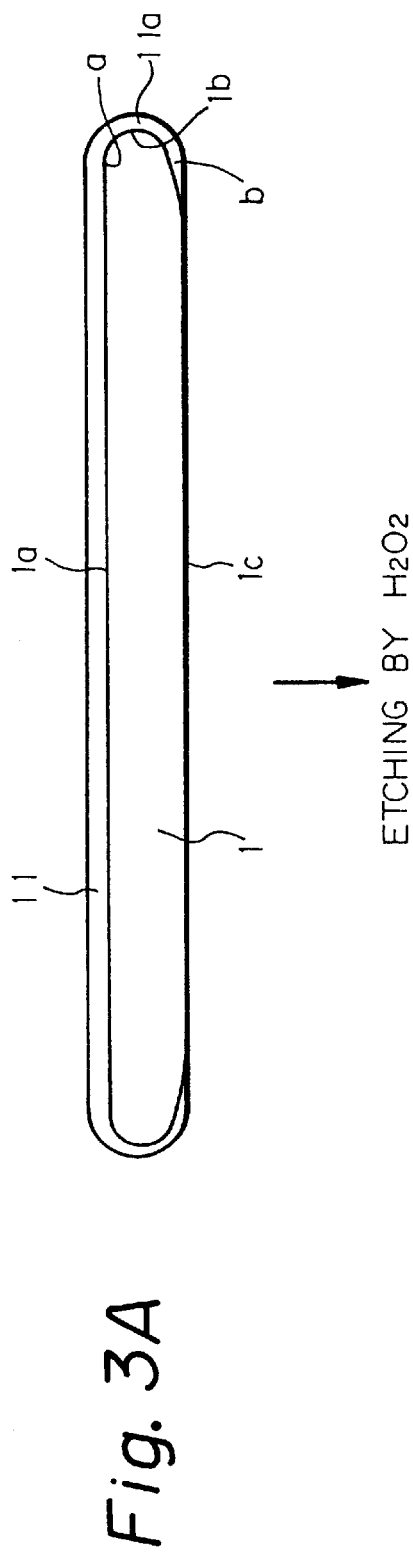
FIGS. 3A and 3B are sections demonstrating how an undesirable part of a metal film formed on a semiconductor wafer is removed by an oxidizing solution.

A plurality of semiconductor wafers 1 are stacked on a wafer cassette 2 at preselected intervals. As shown in FIG. 3A, a metal film 11 having a preselected thickness is formed on the front 1a of each wafer 1. In addition, the metal film 11 turns round to the rear 1c of the wafer 1 via the peripheral edge 1b, forming an undesirable metal film 11a. The wafer cassette 2 is immersed in the oxidizing solution filling the bath 7 and provided with resistance to oxidation thereby. The wafer cassette 2 is so configured as to allow the solution to pass therethrough and contact the wafers 1.

The elevator 7b is disposed in the bath 7a and supports the wafer cassette 2. The elevator 7b is elevatable such that the wafers 1 treated in the bath 7a are sequentially raised stepwise to a preselected height above the liquid level one by one. The bath 7a is formed of polyethylene, polypropylene or similar compound resistive to corrosion ascribable to the oxidizing solution.

The wafer conveying section 8 is implemented by a robot 8a movable back and forth in the vertical and horizontal directions and rotatable about its own axis in a horizontal plane. Every time one wafer 1 is raised to the preselected position above the liquid level by the elevator 7b, the robot 8a pulls it out from the wafer cassette 2 and conveys it to the unloader section 9.

The unloader section 9 is implemented by a wafer cup 9a. The wafer cup 9a receives the wafer 1 brought thereto by the robot 8a and then transfers it to the next step.

The operation of the illustrative embodiment will be described specifically hereinafter. The wafer cassette 2 loaded with the wafers 1 each having the configuration shown in FIG. 3A is mounted on the elevator 7b and then lowered into the bath 7a. At this instant, the valve 5 of the bath 7a is held in its closed position.

After the wafers 1 have been set in the bath 7a, the oxidizing solution is introduced into the bath 7a via the feed pipe 3 until the wafers 1 have been immersed in the solution. As a result, the metal film 11 of each wafer 1 is etched by the solution.

In the subsequent step, the metal film 11 on the front 1a of each wafer 1 is expected to be removed as far as the vicinity of the front 1a by the CMP procedure. However, the undesirable metal film 11a on the edge 1b and the peripheral portion of the rear 1c cannot be removed by the CMP procedure.

Researches and experiments showed that the metal film 11a turned round to the rear 1c of the wafer 1 via the edge 1b is thinner than the metal film 11 existing on the front 1a and can be removed by etching earlier than the metal film 11.

When the undesirable metal film 11a on the edge 1b and rear of the wafer 1 are removed by etching, the metal film 11 on the front 1a is apt to remain even after the etching. This, however, does not matter at all because the metal film 11 on the front 1a will be removed by the CMP procedure in the subsequent step.

In light of the above, in the illustrative embodiment, the metal film 11a existing on the edge 1b and rear 1c of the wafer 1 (range a–b, FIG. 3A) is etched and removed by the oxidizing solution filling the bath 7a. In the subsequent polishing step, the above range a–b of the wafer will be enclosed by the previously mentioned ring which prevents the wafer 1 from jumping out.

Specifically, when the wafers 1 are immersed in the oxidizing solution filling the bath 7a, the solution acts on the metal film 11 of each wafer 1 and removes the undesirable metal film 11a by etching. Subsequently, the valve 5 is opened in order to discharge the oxidizing solution. Thereafter, pure water or cleaning liquid is introduced into the bath 7a via the feed pipe 4 in order to clean the wafers, i.e., to lower the content of the oxidizing solution remaining on the wafers 1.

After the above cleaning step, the wafer cassette 2 is raised by the elevator 7b in order to position the wafers 1 at the preselected height one by one. The robot 8a pulls out the wafer 1 raised to the above height and coneys it to the wafer cup 9a. The wafer 1 transferred to the wafer cup 9a has the metal film 11 remaining on its front 1a removed by the conventional CMP procedure, so that a convex plug is formed on the wafer 1.

As stated above, prior to the CMP procedure, the illustrative embodiment removes the undesirable metal film 11a from the circumferential edge 1b and rear 1c of each wafer 1 by using the oxidizing solution; the edge 1b and rear 1c will be enclosed by the previously mentioned ring in the CMP procedure to follow. Therefore, no undesirable metal films will remain on the wafer 1 after the CMP procedure. This obviates contamination ascribable to the metal film 11a.

Figure 4A:
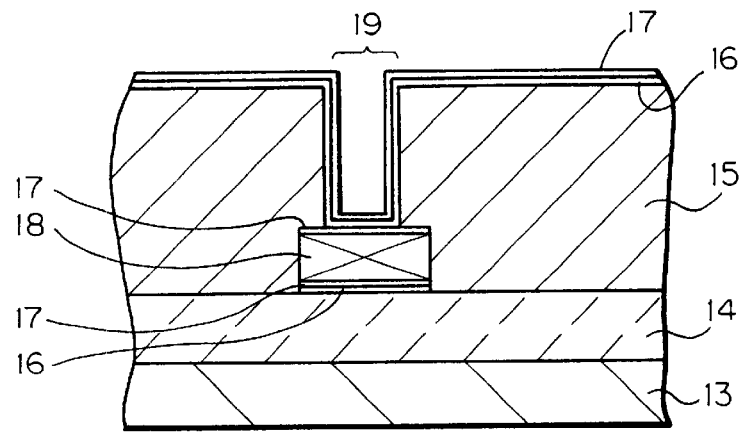
FIGS. 4A–4C are sections showing a sequence of steps for forming a plug in a semiconductor wafer.
Figure 4B:
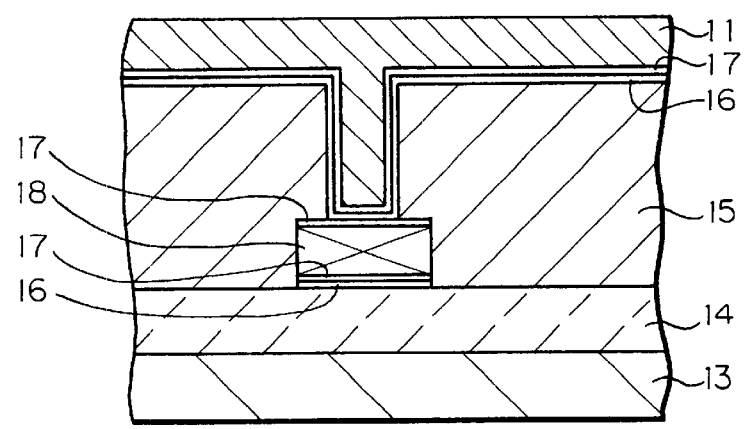

An example of the above embodiment is as follows. As shown in FIG. 4A, a BPSG film or insulation film 14 and a laminate metal wiring constituting of a Ti film 16, a TiN film 17, an AlSiCu film 18 and a TiN film 17 are formed on a substrate 13. Subsequently, a bias ECR $SiO_2$ film 15 is formed as an interlayer insulation film. A through hole 19 is formed in the $SiO_2$ film 15, and then the entire surface of the substrate 13 including the wall of the through hole 19 is covered with the Ti film 16 and TiN film 17. Thereafter, as shown in FIG. 4B, a blanket W film or metal film 11 is formed on the entire surface of the substrate 13 including the wall of the through hole 19. As a result, the through hole 19 is filled with the W film 11.

Figure 3B:
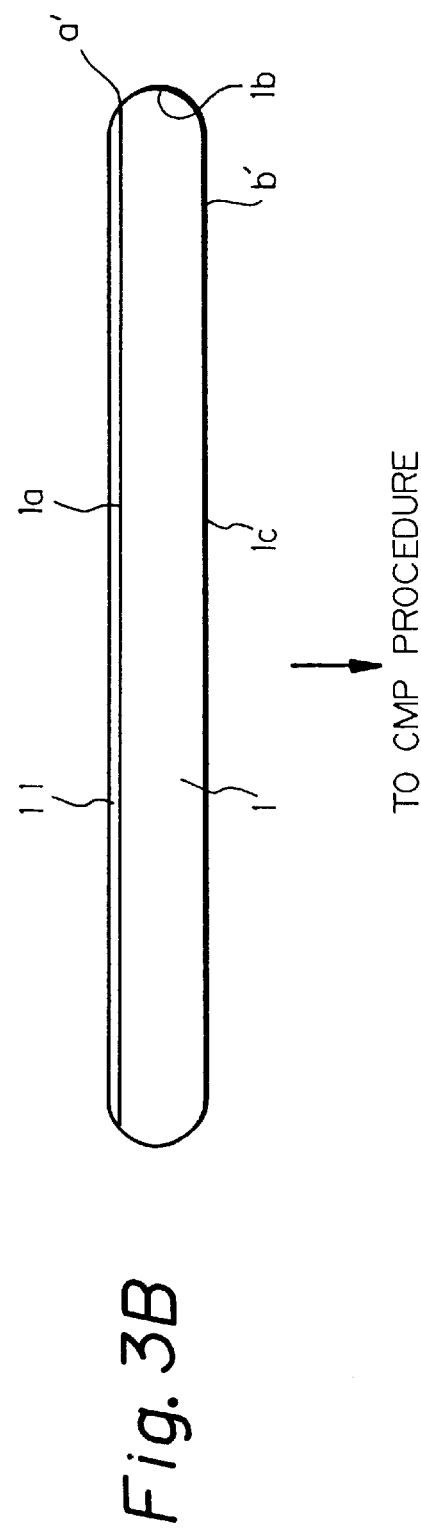

The wafer cassette 2 storing the wafers 1 each having the above specific configuration is bodily immersed in the oxidizing solution, e.g., hydrogen peroxide ($H_2O_2$) solution fed via the feed pipe 3. In this condition, the W film 1 extending over the range a–b of each wafer 1 shown in FIG. 3A is fully removed by etching. The etched range of the wafer 1 is indicated by a–b in FIG. 3B.

The $H_2O_2$ content of the oxidizing solution is selected to be higher than 30% inclusive. The wafers 1 are immersed in the oxidizing solution for a period of time long enough to etch the undesirable portion of the W film 11 from the edge 1b and rear 1c of each wafer 1. For example, when the $H_2O_2$ content of the solution is 30%, the W film 11 on the front 1a is etched at a rate of about 15 nm/min while the W film 11 on the edge 1b and rear 1c is etched at a rate of about 30 nm/min. As a result, while the undesirable part of the W film 11 is fully removed, the W film 11 left on the front 1a has a sufficient thickness for the CMP procedure.

Figure 4C:
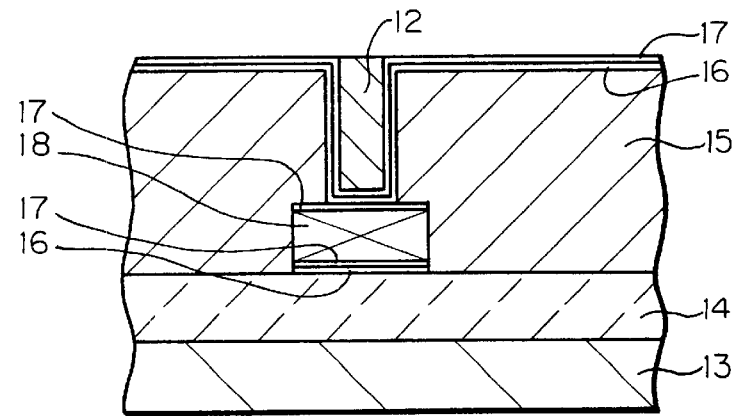

Subsequently, the wafers 1 are cleaned by pure water or cleaning liquid introduced into the bath 7a via the feed pipe 4. Then, the wafers 1 are raised above the liquid level of the bath 7a one by one and transferred to the wafer cup 9 by the robot 8a. This is followed by the conventional CMP procedure using alumina grain or similar abrasive. Specifically, the W film 11 on the front of each wafer 1 is polished by the abrasive so as to form a W plug 12, as shown in FIG. 4C.

As stated above, the illustrative embodiment prevents particles ascribable to the W film 11 likely to remain on the edge 1b and rear 1c of the wafer 1 from being produced and bringing about contamination in the subsequent step.

While the above embodiment immerses the wafers 1 in the oxidizing solution filling the bath 7a, the solution may be applied to the wafers 1 in the form of a shower.

2nd Embodiment

Figure 5:
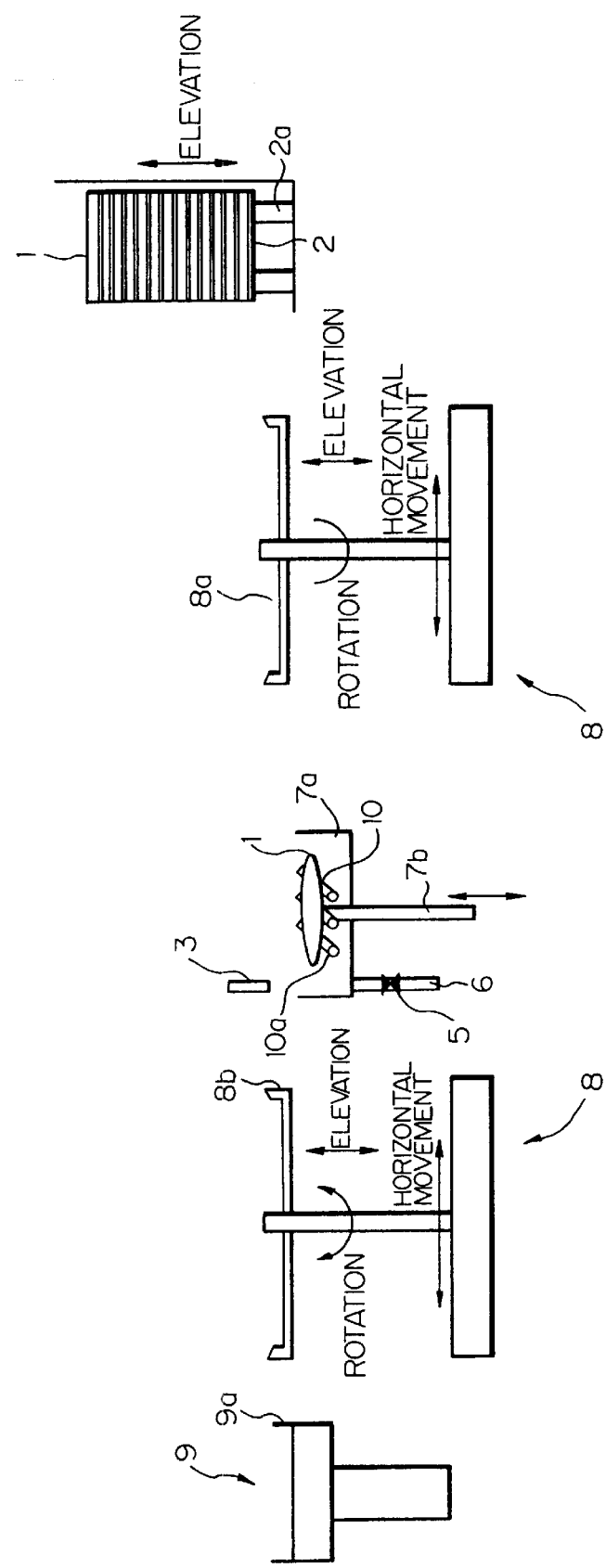
FIG. 5 shows a second embodiment of the present invention.

An alternative embodiment of the present invention will be described with reference to FIG. 5. This embodiment differs from the first embodiment in that it treats the wafers 1 one by one. As shown, the semiconductor wafers 1 are stacked on the wafer cassette 2 positioned outside of the bath 7a and moved up and down by an elevator 2a. The wafer conveying section 8 is made up of a first robot 8a and a second robot 8b. The robot 8a preceding the robot 8b pulls out the wafers 1 from the wafer cassette 2 one by one and conveys them to the bath 7a. The robot 8b following the robot 8a pulls out each wafer 1 raised above the oxidizing solution filling the bath 7a and conveys it to the wafer cup 9a. The feed pipe 3 for feeding the oxidizing solution is communicated to the bath 7a, as in the first embodiment. The difference is that a wafer support 10 for supporting the rear or underside of the wafer 1 is disposed in the batch 7a and moved up and down by an elevator 7b. The wafer support 10 is implemented by bars 10a and immerses the wafer 1 in the solution while supporting it.

In this embodiment, the wafers 1 are oxidized by the oxidizing solution in the bath 7a, but not cleaned by pure water.

An example of the second embodiment is as follows. The wafers 1 also produced by the procedure shown in FIGS. 4A and 4B are stacked on the wafer cassette 2 located outside of the bath 7a. Every time the elevator 7b raises or lowers the wafer cassette 2 stepwise, the robot 8a pulls out one wafer 1 from the cassette 2 and conveys it to the bath 7a. Again, the oxidizing solution fed from the feed pipe 3 is implemented by an $H_2O_2$ solution. The wafer 1 brought to the bath 7a is immersed in the $H_2O_2$ solution in order to remove the undesirable W film 11a from the circumferential edge 1b and rear 1c in exactly the same manner as in the first embodiment.

Subsequently, the wafer 1 on the wafer support 10 is raised above the liquid level of the bath 7a by the elevator 7b. The robot 8b picks up this wafer 1 and transfers it to the wafer cup 9. This is also followed by the CMP procedure using alumina grain or similar abrasive. As a result, the W plug 12 is formed in the through hole 19, as shown in FIG. 4C.

This embodiment also prevents particles ascribable to the W film 11 likely to remain on the edge 1b and rear 1c of the wafer 1 from being produced and bringing about contamination in the subsequent step. While the above embodiment does not effect cleaning using pure water, such cleaning may, of course, be effected, if desired.

3rd Embodiment

Figure 6:
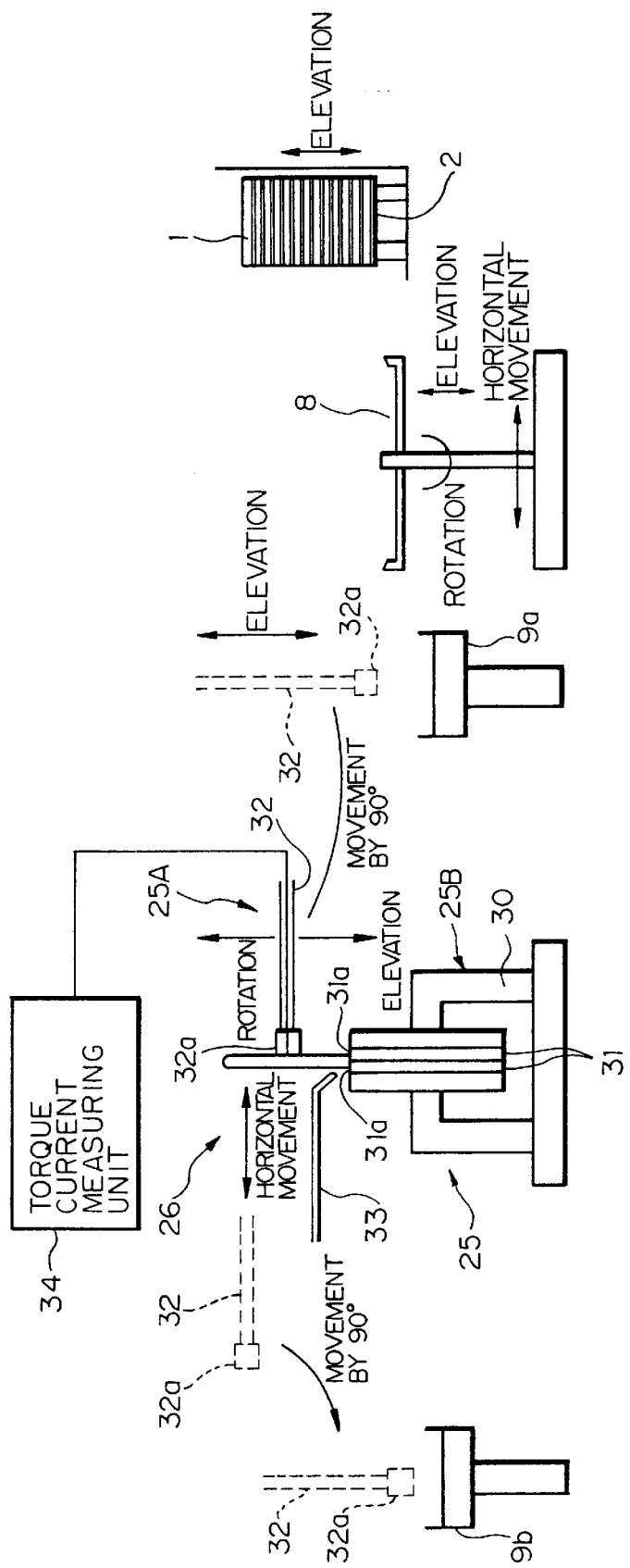
FIG. 6 shows a third embodiment of the present invention.

Reference will be made to FIG. 6 for describing another alternative embodiment of the present invention. As shown, this embodiment includes the wafer cassette 2 movable up or down stepwise, the robot 8 for pulling one wafer 1 from the cassette 2 at a time and positioning it on the wafer cut 9a horizontally, a polishing mechanism 25 for polishing the circumferential edge of the wafer 1, and a wafer conveying section 26 for conveying the polished wafer 1 to another wafer cup 9b and positioning the former on the latter horizontally.

The wafers 1 are stacked on the wafer cassette 2 at preselected intervals. The robot 8 is movable up and down, movable sideways horizontally, and rotatable about its own axis in a horizontal plane. The robot 8 sets the wafer 1 on the wafer cup 9a horizontally.

The polishing mechanism 25 includes a wafer rotating portion 25A and a polishing portion 25B. The wafer rotating portion 25A includes an arm 32 for sucking the center of the wafer 1 by vacuum and causing it to spin. The polishing section 25B includes an abrasive pad support 30, two abrasive pads 31, and an abrasive feed pipe 33. While the wafer 1 is caused to spin, the abrasive pads 31 are brought into contact with the circumferential edge of the wafer 1 in order to remove the undesirable metal film 11a. At this instant, an abrasive is fed to the position where the pads 31 and wafer 1 contact each other.

The arm 32 is implemented as a shaft rotatable about its own axis and having a sucker portion 32a. at its end. The arm 32 is positioned above the wafer cup 9a and positioned vertically with the sucker portion 32a facing downward. After sucking the wafer 1, the arm 32 is angularly moved upward by 90 degrees about its base end to a horizontal position. As a result, the wafer 1 held by the arm 32 is positioned in a vertical position. Then, the arm 32 holding the wafer 1 is moved horizontally to the abrasive pad holder 30.

The two abrasive pads 31 have their fronts adhered to each other and are positioned vertically, as illustrated. In this condition, the polishing surfaces 31a of the pads 31 face upward. The abrasive is fed to the polishing surfaces 31a of the pads 31 via the feed pipe 33. A torque current measuring unit 34 measures a torque acting on the arm 32 and transforms it to a current. The degree to which the pads 31 have polished the edge of the wafer 1 is sensed on the basis of the varying current output from the measuring unit 34.

The arm 32 plays the role of the wafer conveying section 26 at the same time. Specifically, the arm 32 holding the wafer 1 conveys the wafer 1 to a position above the wafer cup 9b in its horizontal position, moves angularly to a vertical position, and then sets the wafer on the cup 9b horizontally.

In operation, as shown in FIG. 6, the robot 8 pulls out one wafer 1 from the wafer cassette 2 at a time and conveys it to the wafer cup 9a. The arm 32 is positioned vertically and caused to suck the wafer 1 away from the wafer cup 9a. The arm 32 holding the wafer 1 is rotated by 90 degrees to a horizontal position and then moved horizontally to a position above the two abrasive pads 31.

While the abrasive is fed to the pads 31 via the feed pipe 33, the arm 32 is lowered while causing the wafer 1 to spin. As a result, the metal film 11a turned round to the edge 1b and rear 1c of the spinning wafer 1 is brought into contact with the abrasive pads 31 and removed thereby. The wafer 1 should preferably spin at rate of 10 rpm to 30 rpm and contact the pads 31 under a pressure of 0.3 psi to 1.0 psi. The abrasive should preferably be fed at a rate of 20 cc/min to 50 cc/min. The polishing operation is ended on the basis of the current output from the torque current measuring unit 34.

Figure 7:
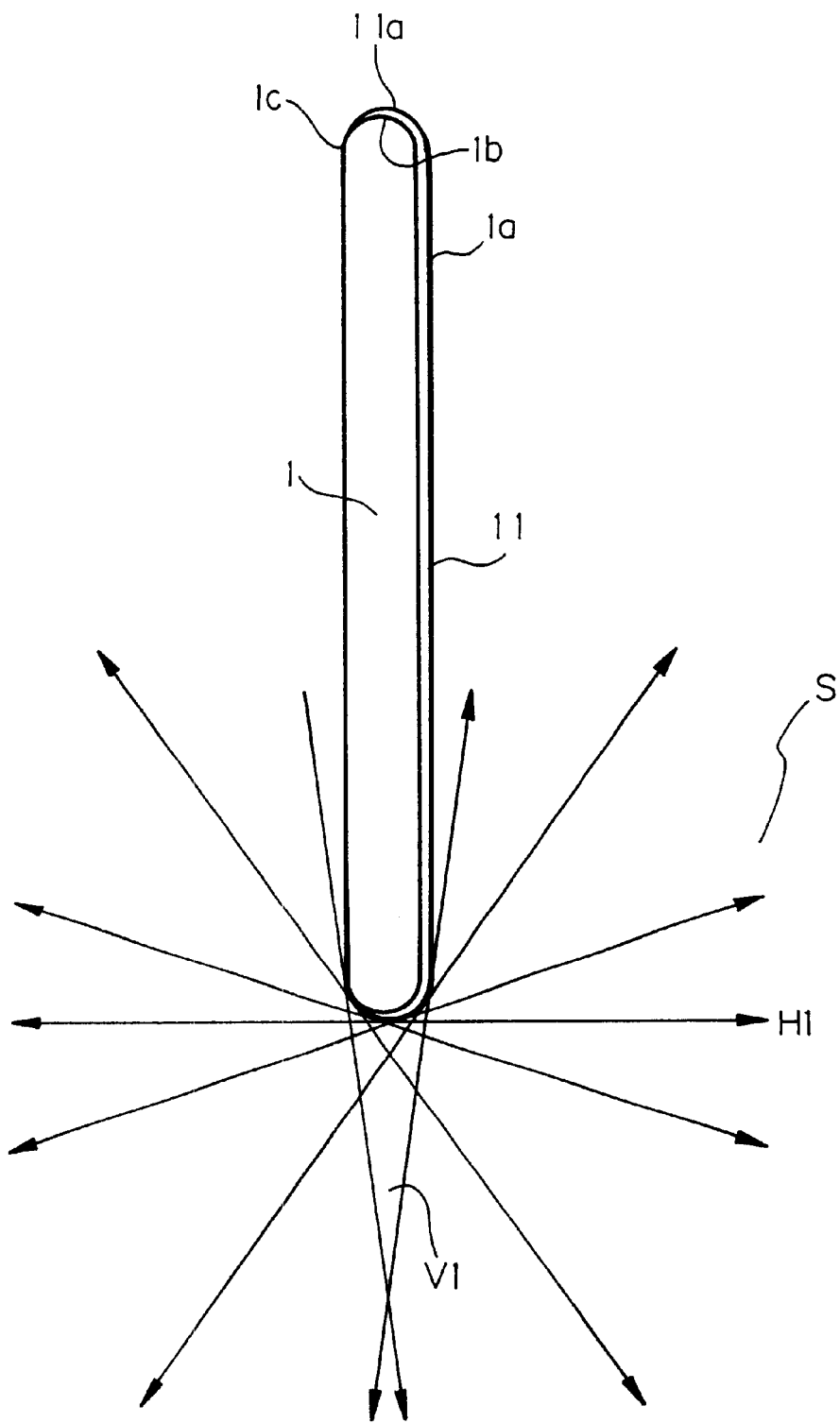
FIG. 7 is a section showing how a metal film is removed by the third embodiment.

Specifically, as shown in FIG. 7, the metal film 11a turned round to the edge 1b and rear 1c of the wafer 1 contacts the abrasive pads 31. Initially, the metal film 11a begins to be polished in a horizontal position H1. Then, the circumferential edge of the wafer 1 gradually bites into the abrasive pads 31 due to a draft force with the result that the polishing range extends to a range V1 covering the edge of the wafer 1. Consequently, the metal film 1 on the edge of the wafer is fully removed by polishing.

Subsequently, the arm 32 holding the wafer 1 is raised and caused to stop rotating. Then, the arm 32 moves the wafer 1 to a position above the wafer cup 9b horizontally, moves angularly by 90 degrees, and then places the wafer 1 on the cup 9b horizontally. This is followed by the CMP procedure using alumina gain or similar abrasive.

This embodiment also prevents particles ascribable to the W film 11 likely to remain on the edge 1b and rear 1c of the wafer 1 from being produced and bringing about contamination in the subsequent step. As shown in FIG. 7, because the varying contact plane S covers substantially the entire edge of the wafer 1, the undesirable W film can be removed as effectively as in FIGS. 3A and 3B.

While the above embodiment uses the torque current measuring unit 34, the degree of polishing may be measured by eye or an optical implementation because the spinning speed of the wafer 1 is as low as 10 rpm to 30 rpm.

In the illustrative embodiment, the solution fed via the feed pipe 33 for removing the W film from the wafer 1 is implemented by an abrasive. Of course, the abrasive may be replaced with an oxidizing solution not containing abrasive grain and selectively acting on the W film.

In summary, it will be seen that the present invention provides a polishing method and a polishing apparatus capable of fully removing an undesirable metal film from the circumferential edge and rear of a semiconductor wafer and thereby obviating contamination ascribable to particles in the subsequent step.

Various modifications will become possible for those skilled in the art after receiving the teachings of the present disclosure without departing from the scope thereof.

What is claimed is:

1. A method of polishing a metal film formed on a semiconductor wafer, comprising the steps of:
   (a) immersing, before polishing the metal film, the wafer in at least one kind of oxidizing solution for a period of time;
   (b) etching, during said period of time an undesirable part of the metal film on a circumferential edge of the wafer by use of the oxidizing solution, and
   removing the wafer from the oxidizing solution after said period of time;
   wherein the period of time is selected to substantially remove the undesirable part while retaining the metal film on a planar surface of said wafer, and
   subsequently subjecting the metal on the planar surface to a CMP step.

2. A method as claimed in claim 1, wherein step (a) comprises immersing a plurality of wafers stacked in a wafer cassette in the oxidizing solution at the same time.

3. A method as claimed in claim 1, wherein step (a) comprises immersing a plurality of wafers in the oxidizing solution one by one.

4. A method as claimed in claim 1, wherein the metal film includes at least one of tungsten (W), copper (Cu), aluminum (Al) alloy, titanium (Ti) alloy, and silicon (Si) alloy.

5. A method for removing a metal film on a semiconductor wafer, comprising the steps of:
   (a) filling a bath with an oxidizing solution; and
   (b) immersing the semiconductor wafer, before polishing, in said bath, wherein the semiconductor wafer is immersed for only a period of time selected to substantially remove an undesirable part of the metal film on a circumferential edge of the wafer while retaining the metal film on a planar surface of said wafer for subsequent CMP.

6. A method of polishing a metal film formed on a semiconductor wafer, comprising the steps of:
   (a) immersing, before polishing the metal film, the wafer in at least one kind of oxidizing solution for a period of time;
   (b) etching, during said period of time, an undesirable part of the metal film on a circumferential edge of the wafer, said undesirable part not removable by polishing, by use of the oxidizing solution; and
   (c) removing the wafer from the oxidizing solution after said period of time,
   wherein the period of time is selected to substantially remove the undesirable part while retaining the metal film on a planar surface of said wafer, and
   subsequently securing said wafer by utilizing a retainer ring positioned about the circumferential edge of the wafer and then
   subjecting the metal film on the planar surface to a CMP step.

* * * * *